(12) United States Patent
Phillips

(10) Patent No.: US 7,259,834 B2
(45) Date of Patent: Aug. 21, 2007

(54) METHOD AND APPARATUS HAVING A RETICLE STAGE SAFETY FEATURE

(75) Inventor: Alton Hugh Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 56 days.

(21) Appl. No.: 10/968,405

(22) Filed: Oct. 18, 2004

(65) Prior Publication Data

US 2006/0082756 A1   Apr. 20, 2006

(51) Int. Cl.
G03B 27/42 (2006.01)
G03B 27/62 (2006.01)

(52) U.S. Cl. .......................................... 355/75; 355/53
(58) Field of Classification Search ................. 355/53, 355/72, 75, 77

See application file for complete search history.

(56) References Cited

U.S. PATENT DOCUMENTS

2002/0080339 A1 * 6/2002 Takahashi ..................... 355/72
2005/0134830 A1 * 6/2005 Van De Ven et al. ......... 355/75

OTHER PUBLICATIONS

International Search Report and Written Opinion of the International Searching Authority for International Application No. PCT/US05/35972, filed Oct. 7, 2005, 8 pp.

* cited by examiner

Primary Examiner—Rodney Fuller
(74) Attorney, Agent, or Firm—Finnegan, Henderson, Farabow, Garrett & Dunner LLP

(57) ABSTRACT

An apparatus and method are disclosed having a stage reticle safety feature. The apparatus includes a reticle stage and an optical stage. The reticle stage supports a reticle and is capable of moving the reticle in x-y-z directions. The optical stage includes a plurality of components to direct light reflected from the reticle onto a wafer substrate and a safety mechanism to move one or more components of the optical stage away from the reticle stage.

24 Claims, 5 Drawing Sheets

METHOD AND APPARATUS HAVING A RETICLE STAGE SAFETY FEATURE

FIELD

The present invention relates generally to photolithography and, more particularly, to a method and apparatus having a reticle stage safety feature.

BACKGROUND

Reticles or masks with patterned images are essential components used in photolithography tools. Conventional tools use transmissive reticles. Specifically, for a transmissive reticle, a light source directs light through the reticle to project a patterned image on a semiconductor substrate covered with light-sensitive photoresist. The captured image in the photoresist defines integrated circuits on the substrate. Typically, tools using transmissive reticles can project features having line widths of 150 to 200 nanometer (nm) that form integrated circuits on the substrate.

In a conventional tool, when a substrate or wafer is ready for receiving a patterned image, the reticle is mounted on a reticle stage that supports and moves the reticle with a certain degree of freedom in the x and y directions. To protect the reticle from contamination, a pellicle can be used, which is a protective membrane that seals off the reticle. The pellicle, however, is not designed to prevent components from colliding with the reticle stage and damaging the reticle.

As integrated circuits become even more compact, the features of a patterned image projected on a substrate require smaller and finer detail. One photolithography technique capable of projecting such features with line widths of 30 nm or less is extreme ultraviolet (EUV) lithography. Instead of using a transmissive reticle, EUV lithography uses a reflective reticle in a vacuum chamber that reflects light with a wavelength in the range of 10 to 14 nm from the reticle to a substrate. A vacuum chamber is needed for EUV lithography to prevent EUV beam attenuation. EUV lithography also requires a number of mirrors and optical components that direct reflected light to the substrate. Such components can form an optical train or stage located below the reticle stage.

For EUV lithography, the reticle stage may require moving the reticle in close proximity to the optical stage. As a result, the reticle stage may move in the z direction as well as in the x and y directions for optical reasons. Consequently, safety features are necessary to prevent components in the optical stage from colliding with the reticle stage and causing irreparable damage to the reticle.

Since reticles are extremely expensive, there is a need to provide safety measures that protect the reticle stage and reticle from colliding with other components.

SUMMARY

According to one aspect of the invention, a photolithography apparatus includes a reticle stage and an optical stage. The reticle stage supports a reticle and is capable of moving the reticle in x-y-z directions. The optical stage includes a plurality of components to direct light reflected from the reticle onto a wafer substrate and a safety mechanism to move one or more components of the optical stage away from the reticle stage.

According to another aspect of the invention, a photolithography method includes mounting a reticle on a reticle stage. The reticle stage moves towards an optical stage. A safety feature is triggered if the reticle stage exceeds a threshold displacement in order to prevent one or more components of the optical stage from colliding with the reticle stage.

According to another aspect of the invention, a photolithography tool includes a plurality of components for performing lithography and a safety feature. The safety feature prevents one of the components from colliding with another component. According to another aspect of the invention, a method for protecting the components includes moving at least one components in a downward direction, and preventing another component from colliding with the moving component in the downward direction.

According to another aspect of the invention, a safety mechanism for a photolithography tool includes a mount, a standoff structure, and an absorption unit. The mount supports an optical component. The standoff structure pushes downward on the mount if in contact with a reticle stage. The absorption unit absorbs the force of the downward push such that the optical component on the mount moves away from the reticle stage.

DRAWINGS

The accompanying drawings, which are incorporated in, and constitute a part of the specification, illustrate exemplary implementations and examples of the invention and, together with the detailed description, serve to explain the principles of the invention. In the drawings, FIG. 1 illustrates one example block diagram of the basic components of an EUV lithography tool having a reticle stage safety feature;

DETAILED DESCRIPTION

Reference will now be made in detail to exemplary implementations, which are illustrated in the accompanying drawings. Wherever possible, the same reference numbers will be used throughout the drawings to refer to the same or like parts.

The following implementations and examples provide safety features and mechanisms that prevent components from colliding with a reticle stage. In this manner, a reticle with a patterned image can be saved from irreparable damage. According to one example, a photolithography apparatus includes a reticle stage and an optical stage. The reticle stage supports a reticle and is capable of moving the reticle in x-y-z directions. The optical stage includes a plurality of components to direct light reflected from the reticle onto a wafer substrate and a safety mechanism to move one or more components of the optical stage away from the reticle stage. In certain examples, the safety mechanism can move a fixed blind unit away from the reticle stage.

Although the following examples are directed to EUV lithography, the reticle stage safety features and mechanisms described herein can be implemented with any type of lithography or lithography tool in order to prevent components from colliding with each other. In one example, the safety features include a standoff structure that pushes components away from the reticle stage if the displacement of the reticle stage exceeds a threshold.

Figure 1:
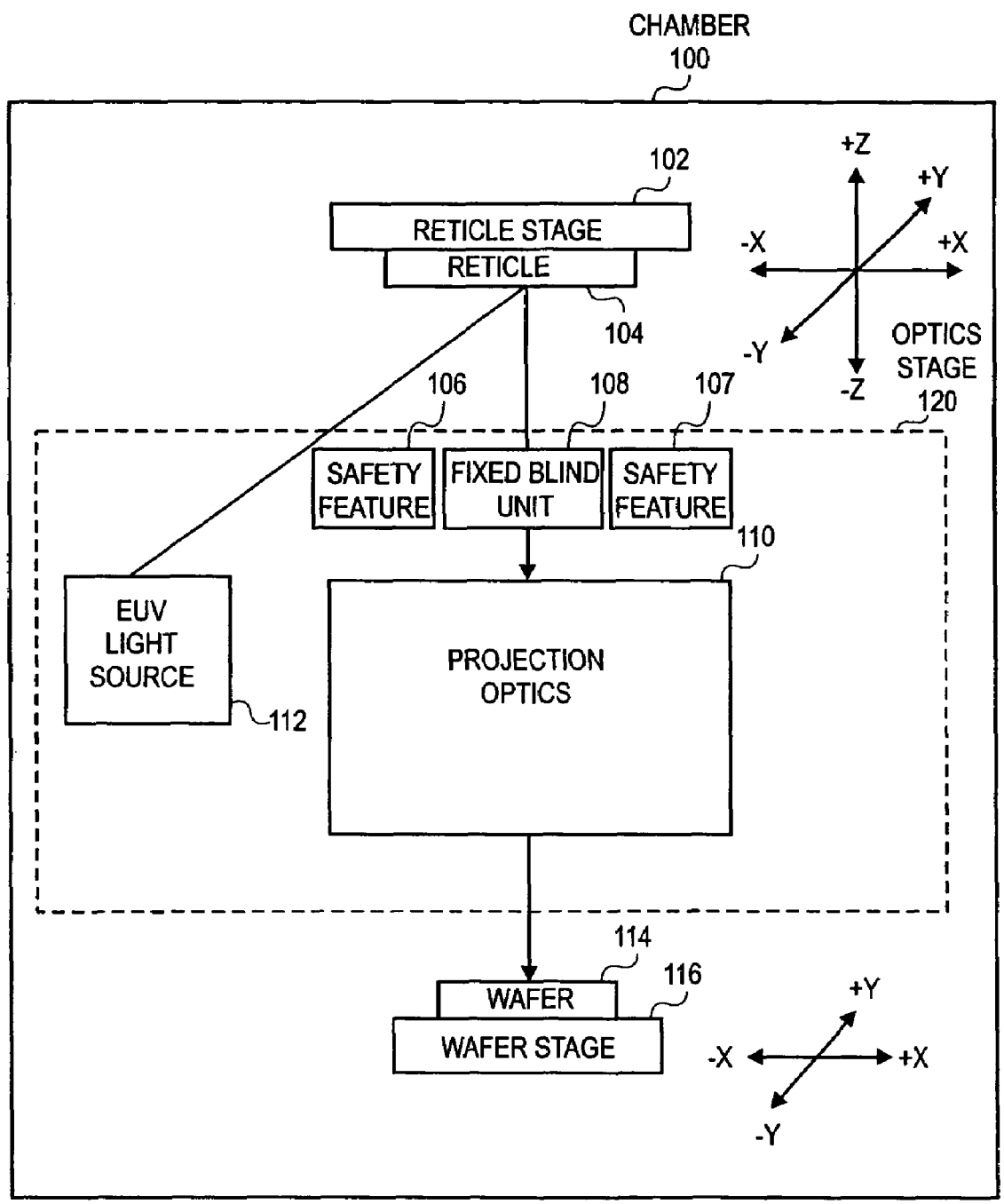

FIG. 1 illustrates one example block diagram of the basic components of an EUV lithography tool having a reticle stage safety feature. As shown, the tool includes a chamber 100 housing a reticle stage 102, optics stage 120, and wafer stage 116. In this example, chamber 100 is a vacuum closed chamber. The reticle stage 102 supports and moves a reticle 104 in the positive (+) and negative (−) x, y, and z directions during lithography. Reticle 104 includes a patterned image that is projected to a wafer 114 on wafer stage 116 using EUV light from an EUV light source 112. The EUV light is reflected off the reticle 104 to project the patterned image. In this example, the projected image on the wafer 114 can be a four times reduction of the patterned image on the reticle 104.

Figure 2A:
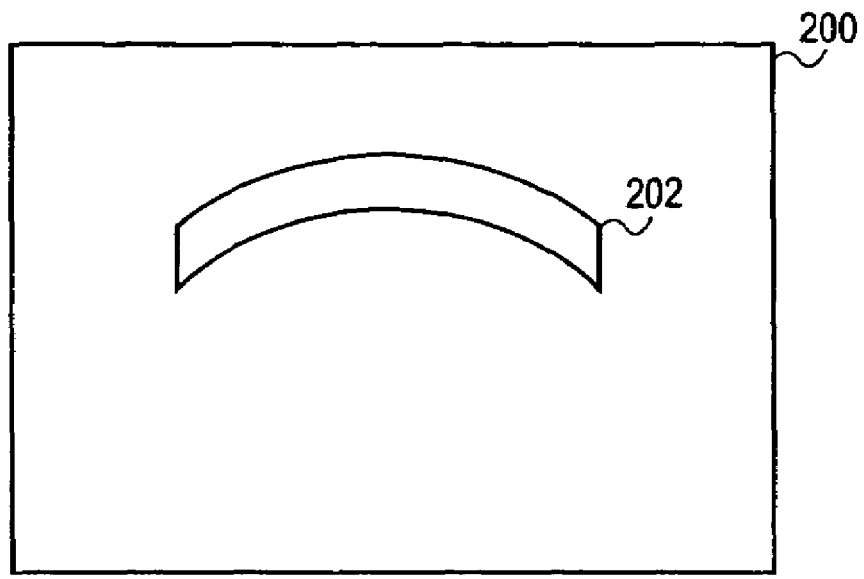
FIG. 2A illustrates one example of a top view of a fixed blind.
Figure 2B:
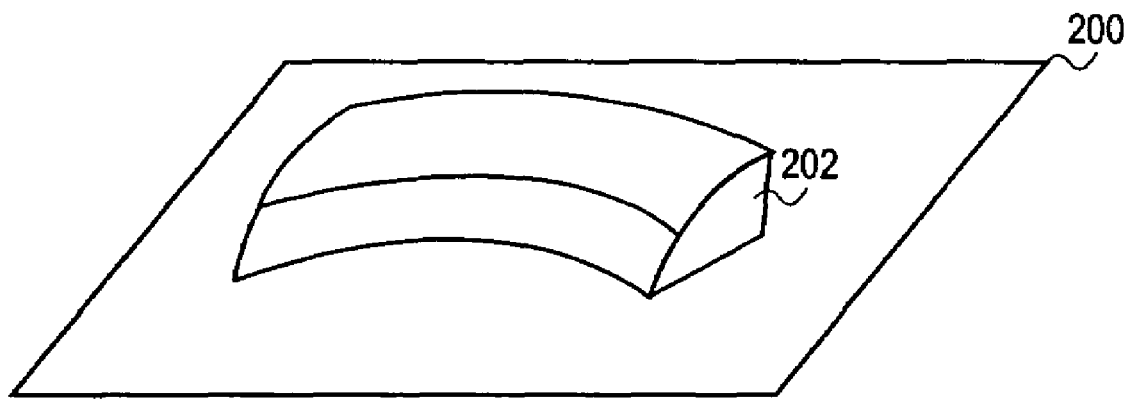
FIG. 2B illustrates one example of a three-dimensional view of the fixed blind of FIG. 2A.

The optics stage 120 includes a fixed blind unit 108 to shape the reflected light in the optics stage 120. For example, referring to FIGS. 2A and 2B, a fixed blind 200 is shown that includes an aperture 202 with a desired shape for shaping the light passing through the aperture 202. The size and shape of aperture 202 can vary for desired specifications. The fixed blind unit 108 can be any type of material that blocks EUV light outside aperture 202. The optics stage 120 also includes projection optics 110 having any number of mirror components that direct reflected light through optics stage 120 onto the wafer 114. The wafer stage 116 can move the wafer 114 in both the x and y directions for scanning purposes.

During EUV lithography, the reticle stage 102 in this example may move in close proximity to fixed blind unit 108 for optical reasons. In other words, the reticle stage 102 is capable of moving in both the + and −z directions with a certain degree of freedom. Since a pellicle is not used for EUV lithography, safety features 106 and 107 are located adjacent to the fixed blind unit 108 in order to prevent the reticle stage 102 from possible collision with the fixed blind unit 108 (or other components) and avoid damaging at least the reticle 104. Although not shown in FIG. 1, the safety features 106 and 107 and fixed blind unit 108 are supported by a mount, which can be a compliant and adjustable mount. As explained in further detail below, safety features 106 and 107 are mechanisms that can move at least the fixed blind unit 108 away from the reticle stage 102 or reticle 104 if the displacement of the reticle stage 102 exceeds a threshold displacement.

The example of FIG. 1 for EUV lithography is exemplary and any number of variations can be made. For example, although not shown, the optics stage 120 can be sealed off from the reticle stage 102 near the fixed blind unit 108. In this manner, chamber 100 can be divided into two different vacuum chambers. Each vacuum chamber can have varying vacuum characteristics for different gas levels. In addition, instead of directing light directly to the reticle 104, the EUV light source 112 can direct light to a mirror component in projection optics 110 that then directs the light to be reflected off a patterned image on the reticle 104.

Figure 3:
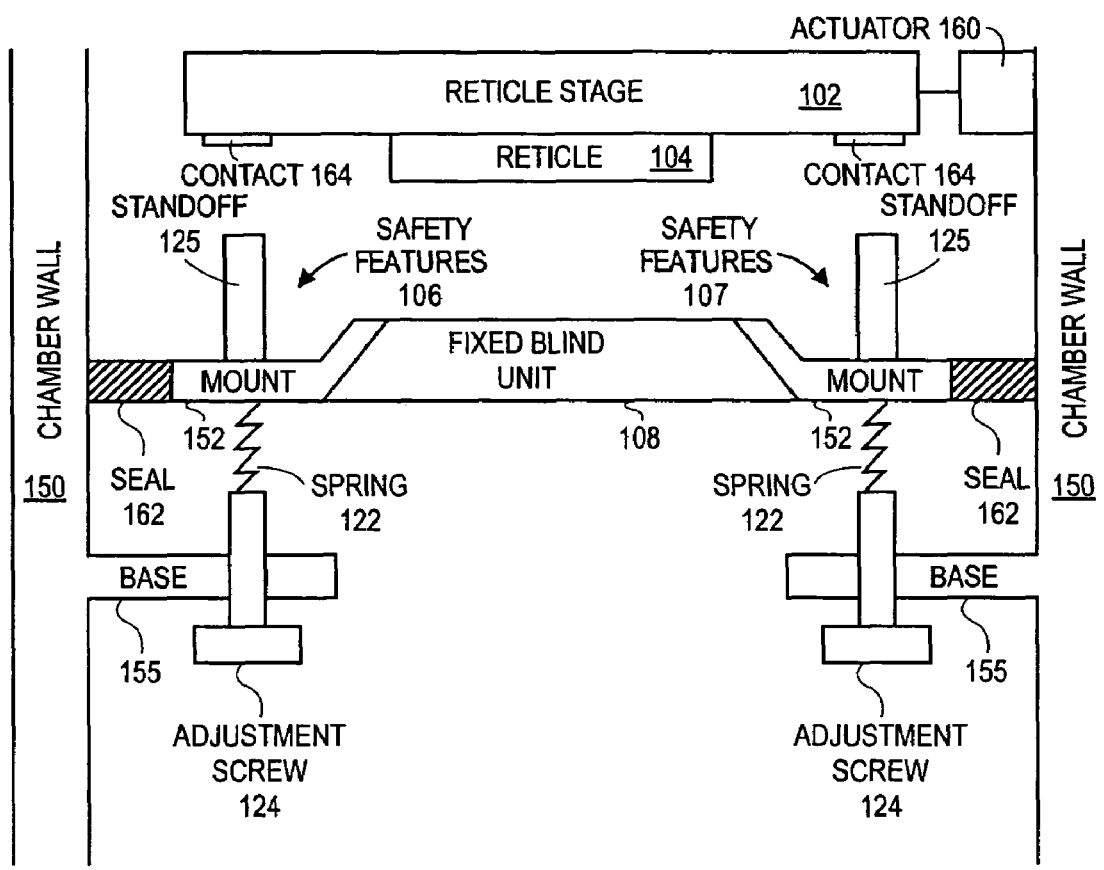
FIG. 3 illustrates one example diagram of a reticle stage with a reticle stage safety feature.

The reticle stage safety features and mechanisms will now be described in further detail regarding FIGS. 3, 4A, and 4B. FIG. 3 illustrates one example diagram of the reticle stage 102 with the reticle stage safety features 106 and 107. In this example, the reticle stage 102 can have a 2 mm stage stroke in which the reticle stage 102 can move 1 mm in the +z direction and 1 mm in the −z direction. An actuator 160 can move the reticle stage 102 in this manner. The clearance distance or gap between the reticle 104 and the fixed blind unit 108 can be equal or less than 1 mm and greater than 0 mm for optical purposes. Since the vertical stroke of the reticle stage 102 can exceed the maximum clearance distance between the reticle stage 102 and fixed blind unit 108, safety features 106 and 107 can be set in place to protect the reticle stage 102 and reticle 104 from colliding with other components, e.g., the fixed blind unit 108.

Safety features 106 and 107 include a standoff structure 125 placed on a mount 152, a spring located under the mount 152 and beneath the standoff structure 125, and an adjustment screw 124 supported by a base 155. The mount 152 can be a compliant and adjustable mount that supports the fixed blind unit 108 and the standoff structure 125. In this example, the gap distance between the standoff structure 125 and the contact 164 of the reticle stage 102 can be 0.5 mm. This distance can determine the threshold displacement for the reticle stage 102 that triggers safety features 106 and 107. That is, as explained in further detail below, if the reticle stage 102 moves in a −z direction that exceeds or even equals the threshold displacement (e.g., 0.5 mm), the safety features 106 and 107 is triggered to cause the fixed blind unit 108 to move away from the reticle stage 102.

The mount 152 and the chamber wall 150 are connected by a seal 162. Seal 162 is shown in block form, however, seal 162 can have any number of shapes and sizes to seal the chamber wall 150. Due to seal 162, two vacuum chambers can exist within the chamber wall 150 for the reticle stage 102 and the optics stage 120. The standoff structure 125 and contact 164 are located under contact 164 of the reticle stage 102. The standoff structure 125 can be a magnetized metal, e.g., magnetized nickel, to provide an ultra clean contact. The spring 122 and adjustment screw 124 can form an absorption unit to absorb any force that is at least pushing downward on the mount 152. The adjustment screw 124 can be used to adjust the neutral position of the fixed blind unit 108.

If the negative (−) z direction vertical stroke of the reticle stage 102 exceeds or even equals the standoff gap or the threshold displacement, which in this example can be 0.5 mm, the safety features 106 and 107 are triggered such that contact 164 of the reticle stage 102 pushes on the standoff structure 125. In other examples, the contact 164 can be embedded in the reticle stage 104 or removed where the contact is the bottom surface of the reticle stage 102. When triggered, the safety features 106 and 107 react by allowing the fixed blind unit 108 to push away from the reticle stage 108 due to the absorption force of the spring 122 connected to the adjustment screw 124. For example, as the reticle stage 102 pushes on the standoff structure 125, the standoff structure 125 pushes downward on the mount 152. Because of the absorption force of the spring 122, when the mount 152 moves downward, the mount 152 causes the fixed blind unit 108 to move downward as well. The displacement distance for the fixed blind unit 108 in this example is dictated by adjustment screw 124 and the absorption force of the spring 122.

Figure 4A:
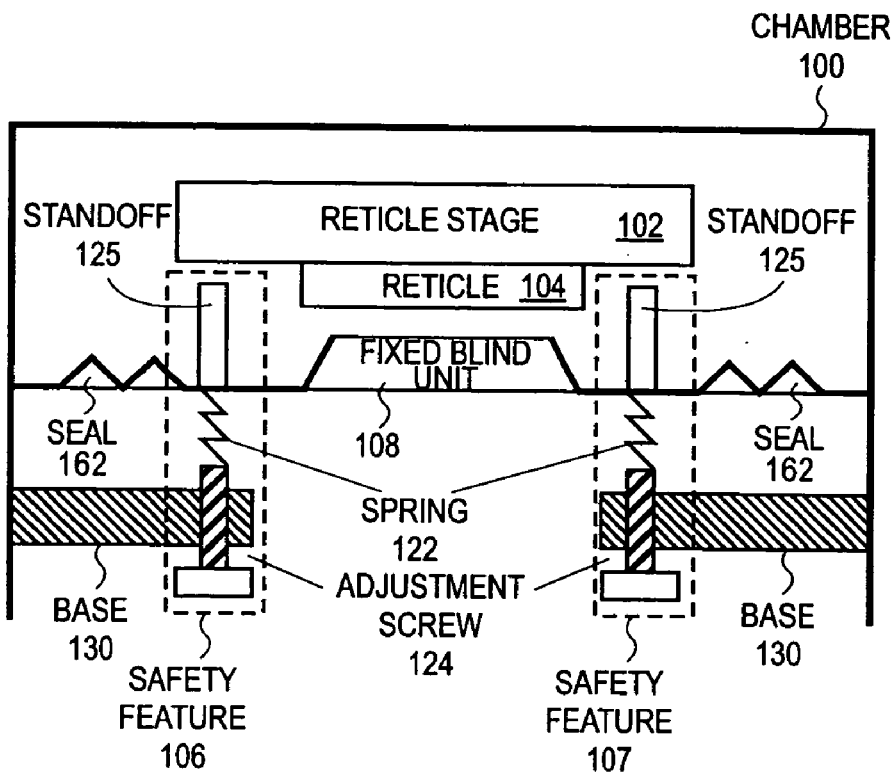
FIG. 4A illustrates one example diagram of a reticle stage in a position that does not trigger a reticle stage safety feature.
Figure 4B:
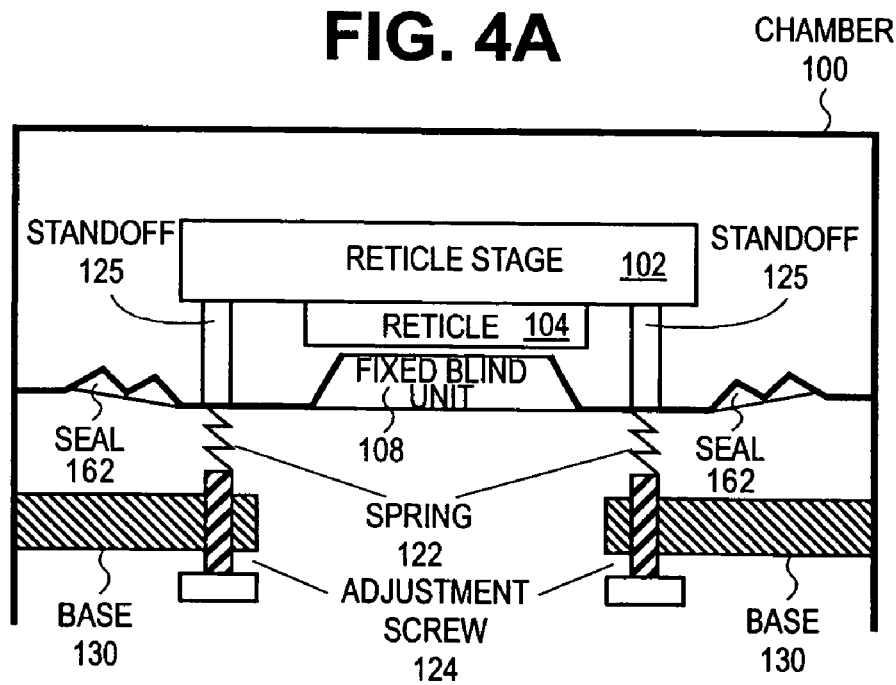
FIG. 4B illustrates one example diagram of a reticle stage in a position that exceeds a threshold displacement and triggers the reticle stage safety feature.

FIGS. 4A and 4B illustrate this operation in further detail. FIG. 4A illustrates one example diagram of the reticle stage 102 in a position that does not trigger the safety features 106 and 107. In this illustration, the reticle stage 102 has not exceeded the threshold displacement in the negative (−) z direction to cause contact with the standoff structure 125. FIG. 4B illustrates one example diagram of the reticle stage 102 in a position that exceeds or equals a threshold displacement and triggers the safety features 106 and 107.

When triggered, as the reticle stage 102 moves downward in the −z direction and pushes on the standoff structure 125, the standoff structure 125 reacts by pushing downward on the mount 152. As a result of the spring force of the spring 122 and flexibility of the seal 162, the downward push causes the fixed blind unit 108 to move away in the −z direction from the reticle stage 102. Additionally, the mount 152 is displaced slightly in the downward direction and can be below the seal 162. Consequently, in this way, the fixed blind unit 108 can avoid colliding with the reticle stage 102 and prevent irreparable damage to the reticle 104.

Figure 5:
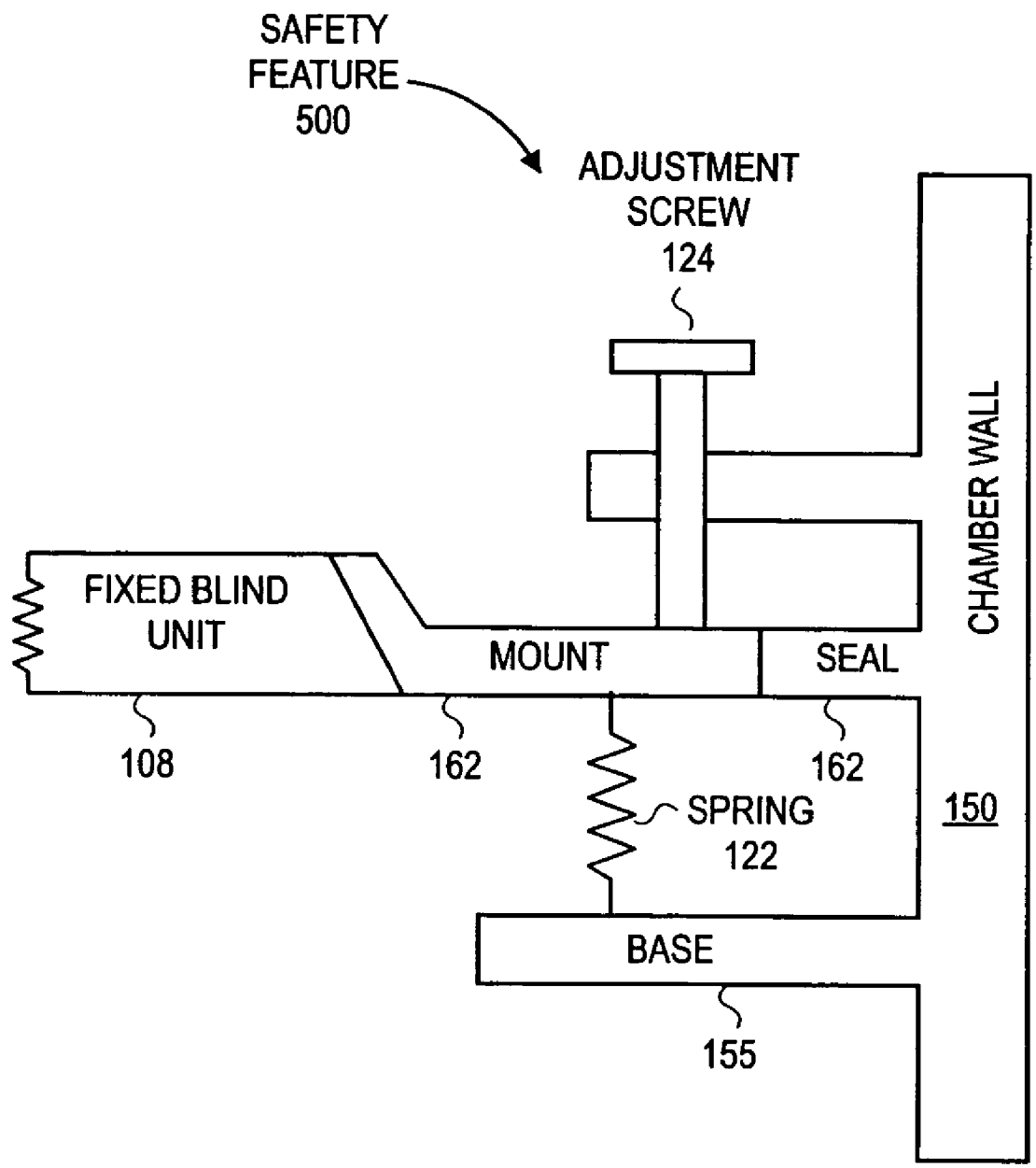
FIG. 5 illustrates one alternative example of a reticle stage safety feature.

FIG. 5 illustrates one alternative example of a reticle stage safety feature 500. In this example, the adjustment screw 124 is located above the mount 152 and can act as a standoff structure. The spring 122 is located under the mount 152 and supported by the based 155. Thus, when safety feature 500 is triggered, as the reticle stage 102 and reticle 104 (not shown) move downward in the −z direction and pushes on the adjustment screw 124, the adjustment screw pushes downward on the mount 152. Due to the spring force of the spring 122 and flexibility of the seal 162, the downward push causes the fixed blind unit 108 to move away in the −z direction from the reticle stage 102. In this way, less components are needed since the adjustment screw can act as a standoff structure so that fixed blind unit 108 can avoid colliding with the reticle stage 102 and prevent irreparable damage to the reticle 104.

Thus, a method and apparatus having a stage reticle safety feature have been described. Furthermore, in the foregoing specification, the invention has been described with reference to specific exemplary embodiments and implementations thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A photolithography apparatus comprising:
    a reticle stage to support a reticle and capable of moving the reticle in x-y-z directions; and
    an optical stage including a plurality of components to direct light reflected from the reticle onto a wafer substrate and a safety mechanism to move one or more components of the optical stage away from the reticle stage,
    wherein the optical stage includes a fixed blind unit positioned to shape the light reflected within the optical stage and one more optical mirror to direct reflected light to a substrate.

2. A photolithography apparatus comprising:
    a reticle stage to support a reticle and capable of moving the reticle in x-y-z directions; and
    an optical stage including a plurality of components to direct light reflected from the reticle onto a wafer substrate and a safety mechanism to move one or more components of the optical stage away from the reticle stage,
    wherein the safety mechanism connects with a fixed blind unit and moves the fixed blind unit away from the reticle stage.

3. The photolithography apparatus of claim 2, wherein the safety mechanism includes a standoff structure that when the reticle stage pushes on the stand off structure the standoff structure moves the fixed blind unit away from the reticle stage.

4. The photolithography apparatus of claim 3, wherein the safety mechanism further includes a spring to absorb the pushing force of the standoff structure.

5. The photolithography apparatus of claim 3, wherein the safety mechanism further includes an adjustment screw to adjust a neutral position of the fixed blind unit.

6. The photolithography apparatus of claim 3, wherein the standoff structure includes a magnetized metal.

7. The photolithography apparatus of claim 6, wherein the reticle stage includes a metal contact to interface with the magnetized metal standoff structure.

8. A photolithography method comprising:
    mounting a reticle on a reticle stage;
    moving the reticle stage towards an optical stage; and
    triggering a safety feature if the reticle stage exceeds a threshold displacement in order to prevent one or more components of the optical stage from colliding with the reticle stage, wherein the triggering the safety feature includes pushing one or more components of the optical stage away from the reticle stage; and
    pushing a fixed blind unit of the optical stage away from the reticle stage.

9. The photolithography method of claim 8, wherein the triggering the safety feature includes absorbing a force caused by the reticle stage making contact with a standoff structure of the safety feature.

10. The photolithography method of claim 9, wherein the displacement threshold is greater than or equal to a gap distance between the standoff structure and the reticle stage.

11. The photolithography method of claim 10, the safety feature is triggered if the reticle stage moves in a vertical downward direction that exceeds the threshold displacement.

12. A photolithography tool comprising:
    an extreme ultraviolet (EUV) light source;
    a reticle stage with a reticle, the reticle stage capable of movement in a vertical direction, the reticle capable of reflecting light from the EUV light source;
    a fixed blind unit to shape light reflected from the reticle stage;
    projection optics to direct the shaped light from the fixed blind unit onto a wafer;
    safety features adjacent to the fixed blind unit to prevent at least the fixed blind unit from colliding with the reticle stage or reticle;
    an adjustable mount to support the fixed blind unit; and
    a standoff structure as part of the safety features attached to the adjustable mount, wherein the standoff structure pushes on the adjustable mount if the safety features are trigged.

13. The photolithography tool of claim 12, wherein the safety features move the fixed blind unit away from the reticle stage.

14. The photolithography tool of claim 13, wherein if the vertical direction displacement of the reticle stage exceeds a displacement threshold, the safety features are triggered and moves the fixed blind unit away from the reticle stage.

15. The photolithography tool of claim 12, further comprising:
    an absorption mechanism connected with the adjustable mount and to absorb force of from the adjustable mount caused by the standoff structure such that the fixed blind unit is capable of moving away from the reticle stage.

16. A photolithography tool comprising:
  a plurality of components for performing lithography, wherein the plurality of components includes a reticle stage and an optical stage having a blind unit thereon; and
  a safety feature configured to move the reticle stage away from the optical stage to prevent the reticle stage from colliding with the optical stage.

17. The photolithography tool of claim 16, wherein the safety features pushes one of the components away from another component.

18. The method of claim 17, further comprising:
  pushing the other component away from the moving component in the downward direction.

19. A safety mechanism for a photolithography tool comprising:
  a mount supporting an optical component;
  a stand off structure to push downward on the mount if in contact with a reticle stage; and
  an absorption unit to absorb the force of the downward push such that the optical component on the mount moves away from the reticle stage,
  wherein the standoff structure includes a magnetized metal.

20. The safety mechanism of claim 19, wherein the mount is adjustable and movable.

21. The safety mechanism of claim 19, wherein the standoff structure pushes downwards if the reticle stage is displaced that exceeds a threshold.

22. The safety mechanism of claim 19, wherein the absorption unit includes a spring connected to an adjustment screw, the spring absorbing the downward push that causes the mount and the optical component to move downward and away from the reticle stage.

23. The safety mechanism of claim 19, wherein the adjustment screw is capable of adjusting the absorption force of the spring.

24. The safety mechanism of claim 23, wherein the adjustment screw is supported by a base unit.

* * * * *

UNITED STATES PATENT AND TRADEMARK OFFICE
CERTIFICATE OF CORRECTION

PATENT NO. : 7,259,834 B2  
APPLICATION NO. : 10/968405  
DATED : August 21, 2007  
INVENTOR(S) : Alton Hugh Phillips It is certified that error appears in the above-identified patent and that said Letters Patent is hereby corrected as shown below:

In claim 3, column 6, line 1, "the stand off structure the standoff" should read --the standoff structure, the standoff--.

In claim 11, column 6, line 33, "claim 10, the safety" should read --claim 10, wherein the safety--.

In claim 12, column 6, line 53, "trigged." should read --triggered.--.

In claim 15, column 6, line 64, "force of from" should read --force from--.

In claim 17, column 7, line 10, "features pushes" should read --feature pushes--.

In claim 19, column 7, line 18, "stand off" should read --standoff--.

In claim 23, column 8, line 14, "claim 19," should read --claim 22,--.

Signed and Sealed this

Twenty-ninth Day of April, 2008

JON W. DUDAS  
*Director of the United States Patent and Trademark Office*